United States Patent [19]
Gybin et al.

[11] Patent Number: 6,020,436
[45] Date of Patent: Feb. 1, 2000

[54] PHOTOSENSITIVE RESIN COMPOSITION

[75] Inventors: Alexander S. Gybin; Lawrence C. Van Iseghem, both of Duluth, Minn.

[73] Assignee: The Chromaline Corporation, Duluth, Minn.

[21] Appl. No.: 08/028,420

[22] Filed: Mar. 9, 1993

[51] Int. Cl.$^7$ .................................................. C08F 271/02
[52] U.S. Cl. ............................ 525/279; 525/59; 525/302
[58] Field of Search ............................... 525/59, 279, 302

[56] References Cited

U.S. PATENT DOCUMENTS

| | | |
|---|---|---|
| 2,448,542 | 9/1948 | McQueen et al. |
| 2,811,510 | 10/1957 | Leubner et al. |
| 3,462,274 | 8/1969 | Maeder et al. |
| 3,647,442 | 3/1972 | Malster . |
| 3,847,615 | 11/1974 | Yoshida et al. |
| 3,892,575 | 7/1975 | Watts et al. |
| 3,993,486 | 11/1976 | Oishi . |
| 4,009,031 | 2/1977 | Carlson et al. |
| 4,038,082 | 7/1977 | Yoshida et al. |
| 4,069,050 | 1/1978 | Hara et al. |
| 4,127,506 | 11/1978 | Gray et al. |
| 4,229,522 | 10/1980 | Nakamura et al. |
| 4,245,027 | 1/1981 | Takeda et al. |
| 4,278,751 | 7/1981 | Specht et al. |
| 4,279,721 | 7/1981 | Kirchmayr et al. |
| 4,284,485 | 8/1981 | Berner . |
| 4,288,525 | 9/1981 | Shepherd et al. |
| 4,368,253 | 1/1983 | Green et al. |
| 4,413,138 | 11/1983 | Curtis . |
| 4,449,175 | 5/1984 | Curtis et al. |
| 4,449,176 | 5/1984 | Curtis et al. |
| 4,459,416 | 7/1984 | Curtis et al. |
| 4,517,276 | 5/1985 | Lewis . |
| 4,548,890 | 10/1985 | Dickinson et al. |
| 4,564,580 | 1/1986 | Ichimura et al. |
| 4,564,581 | 1/1986 | Curtis et al. |
| 4,659,649 | 4/1987 | Dickinson et al. |
| 4,677,048 | 6/1987 | Lee et al. |
| 4,777,114 | 10/1988 | Ichimura . |
| 4,795,692 | 1/1989 | Anderson et al. |
| 4,816,386 | 3/1989 | Gotoh et al. |
| 4,900,617 | 2/1990 | Smith . |
| 4,917,993 | 4/1990 | Mukonoki et al. |
| 4,992,353 | 2/1991 | Rodakis et al. |
| 5,015,416 | 5/1991 | Reid . |
| 5,061,603 | 10/1991 | Hamilton et al. |
| 5,073,303 | 12/1991 | Reid . |

FOREIGN PATENT DOCUMENTS

| | | |
|---|---|---|
| 130804 | 9/1985 | European Pat. Off. |
| 63-198045 | 8/1988 | Japan . |
| 1408466 | 2/1973 | United Kingdom . |

OTHER PUBLICATIONS

Borden et al., "Photopolymer Design: Photocrosslinkable Styrylpyridinium Substituted Vinyl Polymers with Absorption Maxima from 270 nm to 540 nm", *Makromolekulare Chemi*, vol. 178, pp. 3035–3049 (1977).

Borden et al., "Photosensitive Polymers", *Chemical Abstracts*, vol. 72, p. 10 (1970).

Borden et al., "Light–Sensitive Polymers", *Radiation Chemistry and Photochemistry*, vol. 72, p. 395 (1970). (Abstract).

Borden et al., "Light–Sensitive Polymers", *Off. Gaz.*, 872(2), 357–358(1970).

Williams et al., "Cis and Trans Isomers of 2–styrylpyridine", *The Journal of Organic Chemistry*, vol. 26, pp. 4893–4895 (1961).

Williams, "Photodimerization of 2–styrylpyridine", *The Journal of Organic Chemistry*, vol. 25, No. 11, pp. 1839–1840 (1960).

Ichimura, "Preparation of Water–Soluble Photoresist Derived from Poly(vinyl Alcohol)", *Journal of Polymer Science*, vol. 20, 1411–1417 (1982).

Ichimura, "Preparation and Characteristics of Photo–cross–linkable Poly(vinyl Alcohol)", *Journal of Polymer Science*, vol. 20, 1419–1432 (1982).

*Primary Examiner*—David W. Wu
*Assistant Examiner*—Ling-Siu Choi
*Attorney, Agent, or Firm*—Merchant & Gould P.C.

[57] ABSTRACT

A universal method to make photosensitive polymers from poly(vinyl alcohol) and poly(vinyl pyridine) is disclosed which generally does not require final purification. These polymers comprise a heterocyclic, light-sensitive pendant group including a moiety having the formula:

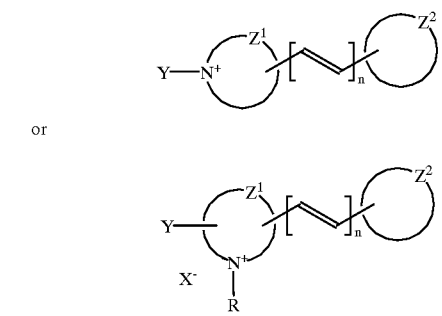

or wherein $Z^1$ denotes the atoms necessary to form a substituted or unsubstituted aromatic heterocyclic ring; $Z^2$ denotes the atoms necessary to form a substituted or unsubstituted aromatic or aromatic heterocyclic ring; R is hydrogen or a substituted or unsubstituted alkyl group; M is a divalent organic moiety; Y is a residue from a grafting group that is capable of grafting the pendant group onto a polymeric backbone.

16 Claims, No Drawings

PHOTOSENSITIVE RESIN COMPOSITION

FIELD OF THE INVENTION

The invention relates to photoresist compositions comprising a polymeric backbone and a quaternary heterocyclic pendant group and other components, particularly useful in the preparation of screen printing photoresists. The invention also relates to methods of preparing photocross-linkable polymeric systems which do not require purification steps.

The photocross-linkable polymeric systems of the invention are used in those photochemical processes in which photocross-linking occurs to form a latent image which may be developed with a suitable developer. The invention also relates to aqueous solutions, aqueous dispersions, film-like resists, printing plates, screen stencils, and methods of photoimaging using the active polymer system. These systems typically do not use silver halide emulsions.

BACKGROUND OF THE INVENTION

Photosensitive or photoreactive polymers are commonly used in coatings which have properties that can change when exposed to suitable radiation. Such a change in properties is usually a change in solubility and results in a sharp distinction between exposed and unexposed areas. Photocross-linking and photoinitiated polymerization are commonly used to exploit the photosensitivity of materials. This invention relates to photocross-linking between ethylenically unsaturated sites. Exposure to light of the photosensitive or photoreactive material results in a solubility change and creation of image in the exposed material. Most commonly, resist images are produced by solvent development of photoinduced cross-linking (negative processing). Photoresist polymer compositions must satisfy a number of physical property dependent requirements under practical working conditions. The most important, and most difficult, requirements to fulfill are image discrimination, thermal stability, ink resistance, and etch resistance when exposed. For image discrimination, the developing solvent must remove the soluble portion of the exposed material without distorting or swelling the insoluble areas to give a sharp, true image.

Exposure of the photopolymer to light generally provides energy necessary to cross-link adjacent polymeric molecules. In many instances, this provides for a three-dimensional cross-linked polymer. For example, with sufficient exposure to light, a polymer having diazo units becomes hydrophobic. A variety of photo-chemical systems have been used in photoresist applications including cinnamates, chalcones, p-azidophenyls, azidophthalates, p-phenylene, bis(acrylates), and many others.

One class of photosensitive compounds photoresist applications is based on photoinitiated dimerization involving a styryl pendant group, e.g. styryl pyridine. Early work with this class was performed by Douglas G. Borden, Jack L. R. Williams and others at Eastman Kodak, and it is discussed in Borden et al., "Photosensitive Polymers", *Chemical Abstracts,* Vol. 73. p. 10 (1970); Borden et al., "Light-Sensitive Polymers", *Radiation Chemistry and Photochemistry,* Vol. 72, p. 395 (1970); Borden et al., Photopolymer Design: Photocrosslinkable Styrylpyridinium Substituted Vinyl Polymers with Absorption Maxima from 270 nm to 540 nm", *Makromolekulare Chemi,* Vol. 178, pp. 3035–3049 (1977); Williams, "Light-Sensitive Polymeric Quaternary Salts", Williams, "Photodimerization of 2-styrylpyridine", *The Journal of Organic Chemistry,* Vol. 25, No. 11, pp. 1839–1840 (1960); Williams et al., "Cis and Trans Isomers of 2-styrylpyridine", *The Journal of Organic Chemistry,* Vol. 26, pp. 4893–4895 (1961); Leubner et al., U.S. Pat. No. 2,811,510; and Williams, U.S. Pat. No. 2,908,667. This work generally relates to the preparation of polymers having pendant styryl pyridinium functionality. The general preparation of the polymers is set out below:

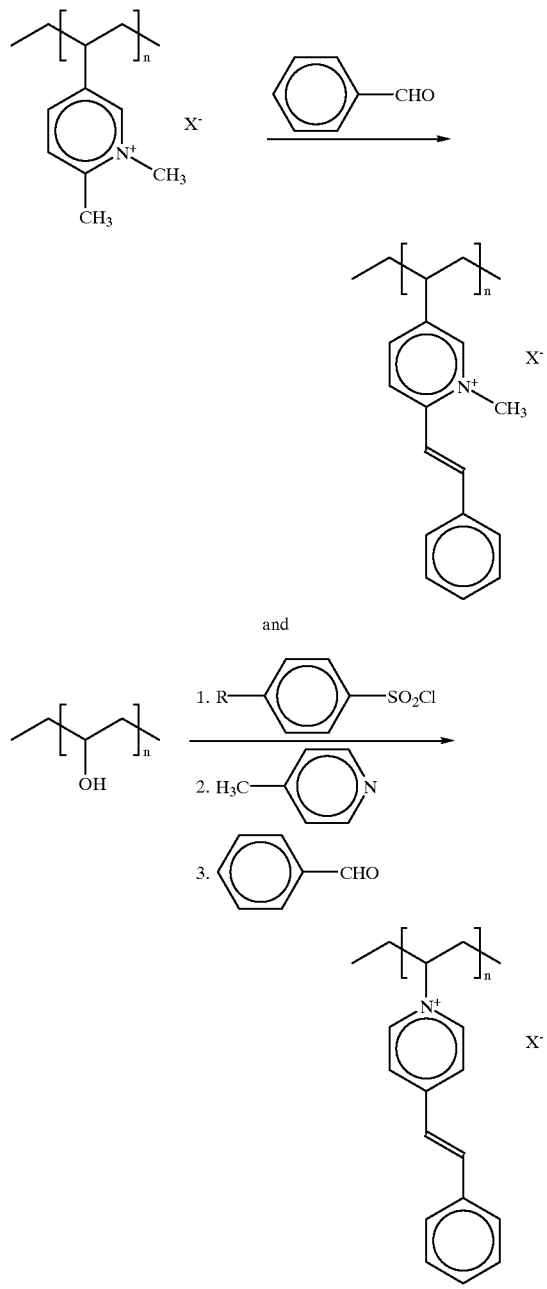

However, the Kodak technology generally required a "special approach" in their synthesis and, more importantly, final purification of the polymer.

Additional work in this area was performed by K. Ichimura and others at the Japanese Research Institute for Polymers and Textiles and is discussed in references including K. Ichimura, J. Poly. Sci. 20, 1411, 1982; K. Ichimura, et al., J. Poly. Sci. 20, 1419, 1982; Ichimura, et al., U.S. Pat. No. 4,777,144 (1988); U.S. Pat. No. 4,564,580 (1986); European Patent No. 130 804 (1984); Japanese Patent No. 63/198045 (1988); etc. This technology involves using an acetal-forming reaction to graft a photodimerizable group onto a polyvinyl alcohol backbone as shown in a cross-linked and uncross-linked form.

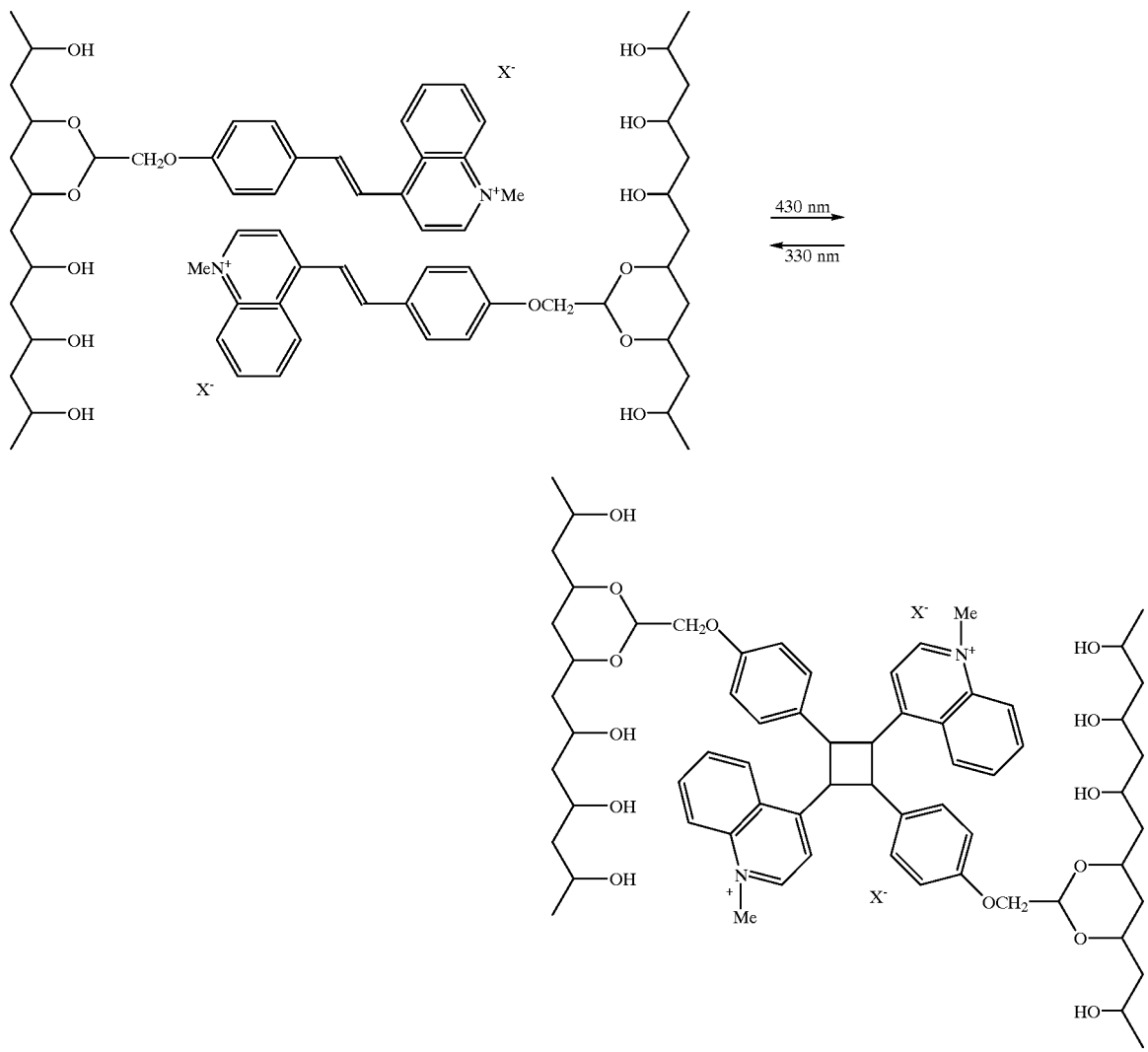

Unfortunately, this technology generally requires specific starting materials and appears to be limited to poly(vinyl alcohol) polymers.

Other water sensitive or water soluble polymeric materials are disclosed in Mukunoki et al., U.S. Pat. No. 4,917,993, which discloses the use of a particular class of water soluble synthetic or natural polymers in silver halide photographic materials. The synthetic polymers disclosed in Mukunoki preferably have nonionic and/or anionic groups appended onto a poly(methyl) backbone which may or may not be otherwise substituted. These appended groups are linked to the poly(methyl) backbone through the following oxygen-containing linking groups: —CONH—, —NHCO—, —COO—, —OCO—, or —O—.

Hamilton, et al., U.S. Pat. No. 5,061,603, discloses photopolymerizable polyvinyl alcohols having a pendant group of the formula:

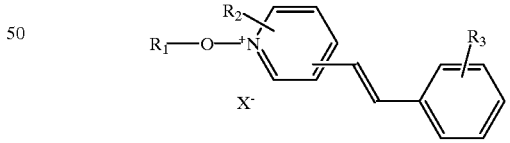

wherein $R_1$–$R_3$ represent various substituents or hydrogen atoms. A particularly preferred $R_1$ is a methyl group. The position disclosed for grafting this group to a polyvinyl alcohol backbone is disclosed as the 4-position of the benzene ring. The formula is disclosed as having high water solubility due to a preferred N-methoxy substituent. This substituent can also fragment to generate free radicals to initiate polymerization of an ethylenically unsaturated secondary polymer matrix, if present. The procedure used to formulate this pendant group requires even more steps than Ichimura et al., and grafting the pendant group to the polymer backbone still requires an aldehyde linkage to the phenyl ring.

A more universal way to make photosensitive polymers from poly(vinyl alcohol) and poly(vinyl pyridine) is needed which does not require final purification, is more flexible in the choice of starting materials, and can produce photosensitive polymers which are of similar photosensitivity whether prepared with a poly(vinyl alcohol) or poly(vinyl pyridine) backbone. In addition, a photosensitive composition is needed having reduced toxicity, increased stability, improved definition, and resistance to higher pH materials.

BRIEF DISCUSSION OF THE INVENTION

The invention relates to photoresists based on a photocross-linkable polymer. The photocross-linkable polymer comprises a polymeric backbone and at least 0.1 mol-% of a quaternary heterocyclic pendant group. The heterocyclic, light sensitive, pendant group includes a moiety having the formula:

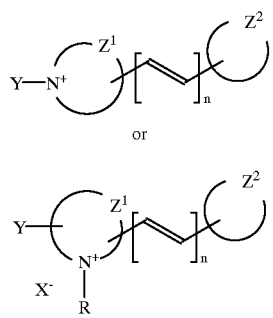

wherein $Z^1$ denotes the atoms necessary to complete a substituted or unsubstituted aromatic heterocyclic ring; $Z^2$ denotes the atoms necessary to complete a substituted or unsubstituted aromatic or aromatic heterocyclic ring; R is hydrogen or a substituted or unsubstituted alkyl group; Y is a residue from a grafting group that is capable of grafting the pendant group onto a polymeric backbone; n is 1 or 2; and $X^-$ is an anion. Generally, Y is the residue from an aldehyde (in its protected or unprotected form), halogen, amine, carboxy, oxy, arylsulfonyl or other suitable moiety, etc. The photocross-linkable polymer has a molecular weight of about 5,000 to 1,000,000.

From another perspective, the present invention may be illustrated as:

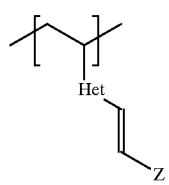

wherein Het is a heterocyclic group and Z may be heterocyclic or aromatic, while the photosensitive compound of Ichimura and others can be illustrated as:

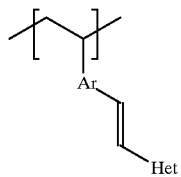

wherein Ar is an aromatic group, and Het is a heterocyclic group.

The aqueous screen printing composition according to the present invention includes a major proportion of an aqueous or solvent base carrier and about 1 to 50 wt-% of a photosensitive polymer composition described above.

The method of forming the photosensitive polymers generally involves (1) reacting an aldehyde substituted aromatic compound and an alkyl substituted nitrogen-containing heterocyclic compound in the presence or absence of a commonly used catalyst to form a first reaction product having a quaternary or quaternizable nitrogen atom; (2) reacting the first reaction product with a substituted or unsubstituted alkyl, aralkyl, or hetero compound having one or more moiety selected from the group consisting of halogen, ester and aldehyde (in its protected or unprotected form) to form a second reaction product; and (3) grafting onto a polyvinyl backbone about 0.1 to 20 mol-% (based on the available reactive sites on the polymeric backbone) of the second reaction product or a derivative thereof to form a photopolymer.

An alternative method of forming the photopolymer generally involves (1) reacting (a) a substituted or unsubstituted alkyl, aralkyl or hereto compound having one or more terminal moieties selected from the group consisting of halogen, ester, acid and aldehyde and (b) an alkyl substituted nitrogen-containing heterocyclic compound to form a first reaction product; (2) reacting the first reaction product with an aldehyde substituted aromatic compound in the presence of a catalyst to form a second reaction product having ethylenic unsaturation and a quaternary nitrogen atom, and grafting onto a polyvinyl backbone about 0.1 to 20 mol-% (based on the available reactive sites on the polymeric backbone) of the second reaction product or a derivative thereof to form a photopolymer.

When the term "aldehyde" is used in the specification and claims, the term encompasses aldehydes in both the protected and unprotected form.

DETAILED DISCUSSION OF THE INVENTION

The photosensitive polymeric material of the present invention comprises a polymeric backbone and quaternary heterocyclic pendant group. The heterocyclic pendant group includes a moiety having the formula:

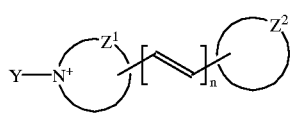

or

-continued

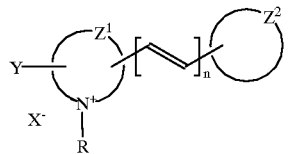

wherein $Z^1$ denotes the atoms necessary to complete a substituted or unsubstituted aromatic heterocyclic ring; $Z^2$ denotes the atoms necessary to complete a substituted or unsubstituted aromatic or aromatic heterocyclic ring; R is hydrogen or a substituted or unsubstituted alkyl group; Y is a residue from a grafting group that is capable of grafting the pendant group onto a polymeric backbone; n is 1 or 2; and $X^-$ is an anion. Generally, Y is the residue from an aldehyde, halogen, amine, carboxy, oxy, arylsulfonyl or other suitable moiety. The photocross-linkable polymer has a molecular weight of about 5,000 to 1,000,000.

The linkage of the pendant group to the polymeric backbone can be discussed with reference to Y in the above structural representation. Y may be a substituted or unsubstituted linear or branched $C_{2-24}$ alkyl, alkoxy, alkaryl, amino, alkylamino, arylamino, aralkyl, aralkoxy, aryloxy, heteroaliphatic, heterocyclic, heteroaromatic, and alkylheteroaromatic. Each linking group may link to one or more active sites on the polymeric backbone. Preferred linking groups include a substituted or unsubstituted linear $C_{2-24}$ alkyl, aralkyl, amino, and heterocyclic groups. Particularly preferred linking groups include linear $C_{2-12}$ haloalkyl or corresponding arylsulfonate groups such as 1-halobutyl, 1-halopentyl, 1-halohexyl, and 1-halooctyl (bromo groups are most preferred) and heterocyclic, nitrogen-containing groups such as:

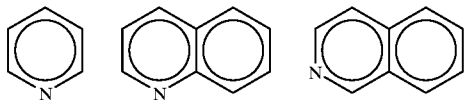

The linkage to active sites on the polymeric backbone is largely dependent upon the particular structure of the backbone. For example, a backbone derived from poly(vinyl pyridine) will generally result in the linkage of the pendant moiety through a single active site of a pyridine ring. On the other hand, a backbone derived from partially saponified poly(vinyl acetate) or poly(vinyl alcohol) will generally result in the linkage of the pendant moiety through one or two adjacent oxygen atoms along the backbone.

The photopolymers of the present invention are more flexible, both in physical properties and in choice of actual pendant group structure. The linkage between the photosensitive ethylenic unsaturation and the polymeric backbone can provide a number of beneficial functions. In particular, surface active linkages can be used. Also, it is easier to make a substituted styryl pyridine (mono- or polysubstituted) pendant group due to the wide commercial availability of commercial substituted aromatic aldehydes.

The nitrogen-containing heterocyclic ring may be any nitrogen-containing aromatic heterocyclic ring or multiple ring system. Representative, non-limiting examples of the aromatic heterocyclic ring include the following structures:

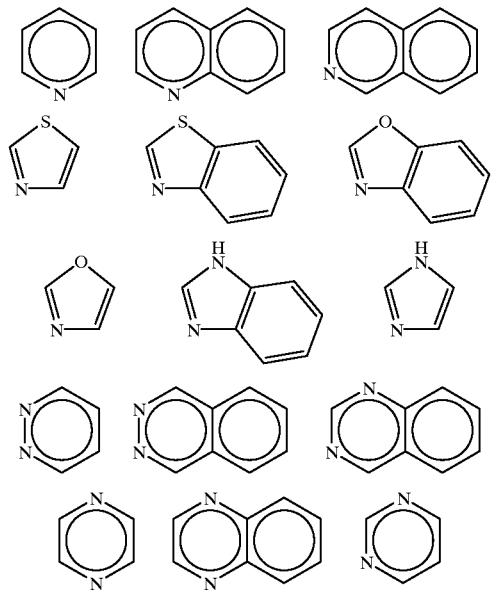

In addition to the structures indicated above, the aromatic heterocyclic rings may include those rings which are substituted with an alkyl group, an alkoxy group, or a hydroxyl group.

The free end of the styryl group preferably comprises a benzene ring or multiple ring structure such as naphthalene, xanthene, etc., or hetero aromatic ring, which ay be further substituted with an alkyl group, an alkoxy group, a hydroxyl, aldehyde, carboxyl, aryl, aryloxy, halo, amino, cyano, or other suitable group.

The polymeric backbone is preferably the result of the polymerization of substituted vinyl monomers, olefins, or acetylenes. Particularly useful backbone polymers include film-forming vinyl polymer resins selected from the group consisting of vinyl alcohol polymers, vinyl acetate polymers, vinyl acetate/ethylene copolymers, vinyl acetate/acrylic acid copolymers, vinyl acetate/acrylic acid ester copolymers, acrylic acid ester polymers, acrylic acid/acrylic acid ester copolymers, styrene polymers, styrene/acrylic acid copolymers, styrene/acrylic acid ester copolymers, vinyl chloride polymers, vinylidene chloride polymers, vinyl acetate/methacrylic acid copolymers, vinyl acetate/methacrylic acid ester copolymers, styrene/butadiene copolymers, acrylonitrile/butadiene copolymers, copolymers of vinyl acetate, homo- and copolymers of vinyl pyridine, homo- and copolymers of dialkylaminoalkylmethacrylates, homo- and copolymers of alkylaminoalkymethacrylates, homo- and copolymers of dialkylaminoacrylates, homo- and copolymers of alkyaminoacrylates, homo- and copolymers of vinylimidazole and homo- and copolymers of vinylsuccinimide.

The above-described pendant quaternary moiety is generally present in an amount of at least about 0.1 mol-% of the available active sites on the photopolymer, preferably about 0.1 to 20 mol-%, and more preferably about 0.5 to 10 mol-% of the polymer. Additional pendant groups may also be present in the photopolymer such as acetate residues. These optional pendant groups may be present at up to about 50 mol-% of the polymer.

The graftable compound of the present invention can be prepared through the following representative syntheses:

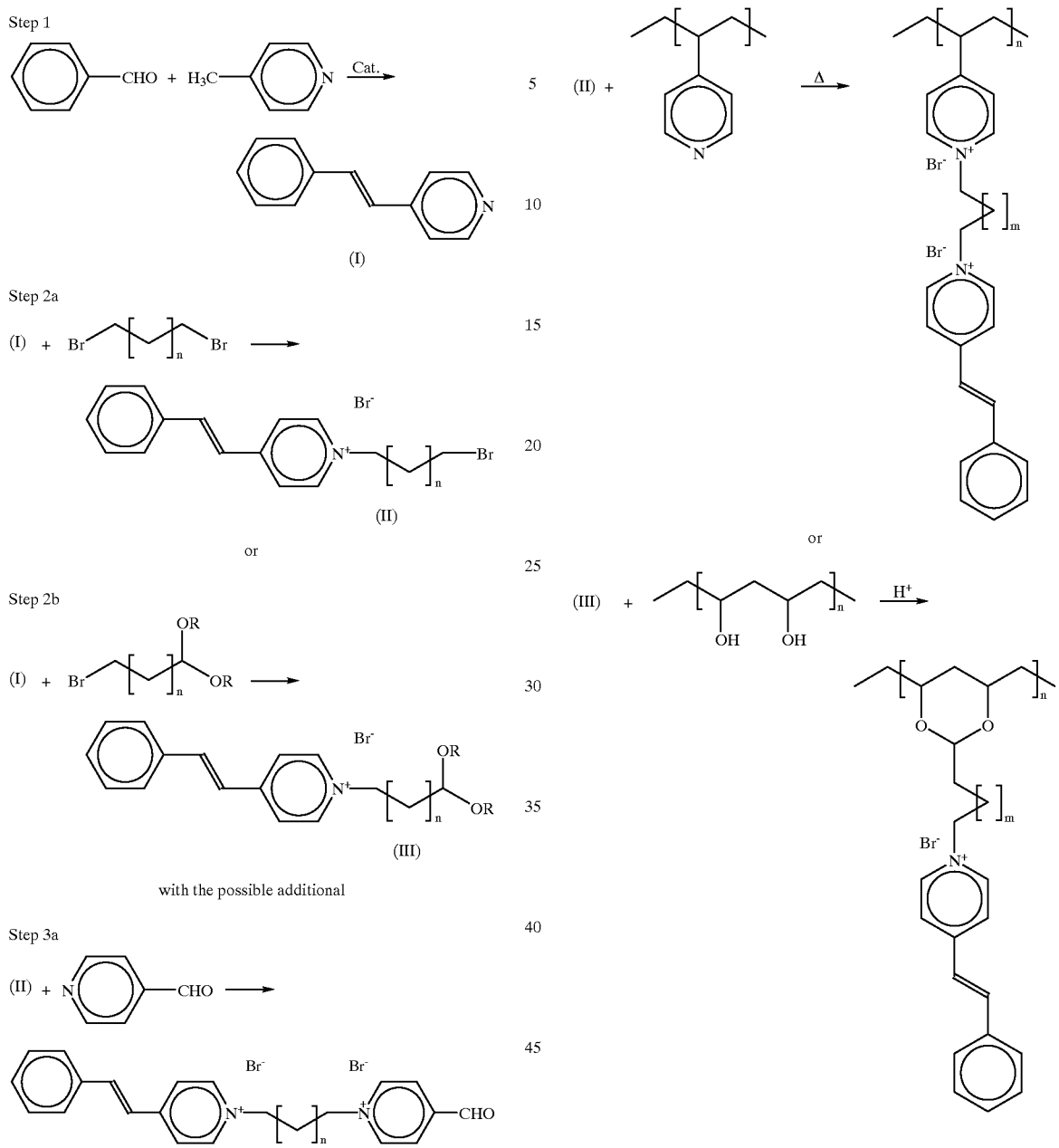

Photopolymers can be prepared by grafting these groups onto a polymeric backbone. Such grafting can occur through the following representative syntheses:

The photopolymers useful in the photoresists of the invention can have a molecular weight of about 5,000 to 1,000,000. At the lower end of the range, the photopolymers may actually be oligomers. At a molecular weight of about 1,000,000 the photopolymers may be cast as films from a melt of about 100% solids. Of course, if the molecular weight is too low, polymerization and photocross-linking may be ineffective to render the material insoluble after imaging and developing. If the molecular weight is too great, the viscosity of an aqueous solution or resin melt may be too high for handling. More preferably, the molecular weight ranges from about 20,000 to 500,000. This range is generally more forgiving, i.e., the formulator has the opportunity to vary composition proportions to balance viscosity, solubility rate, pliability, ductility, and other properties. Most preferably, the polymer has a molecular weight of about 40,000 to 200,000. This range generally is the most versatile and economically viable.

Of course, the ordinary practitioner may desire or need to formulate the photopolymer to meet specific needs. The viscosity of the photoresist composition generally results from a balance of % solids in a solution or dispersion and the molecular weight of the polymer. Increasing either the % solids or the molecular weight generally results in increased viscosity. In addition, as the molecular weight increases it may be necessary to decrease the cross-linkability of the photopolymer so it remains soluble or dispersible in the developer. High viscosity dispersions may be useful to achieve thicker photoresist films and to reduce their cold flow and tack. The incorporation of lower molecular weight polymers or oligomers either as the source of polymers or as a reactive diluent may render the photoresist or stencil harder and more brittle which can be desireable to enhance performance under certain conditions.

The photopolymers of our invention can be used in various forms to provide photosensitive screens, masks, stencils, and the like, for use in negative photoimaging systems. These photoimaging systems develop latent images prior to developing and are typically non-silver halide systems. The photopolymer may be used as a flexible resist or printing plate. The photopolymers are preferably used as a liquid photoresist composition comprising a liquid carrier and about 0.1 to 50 wt-% of at least one photosensitive polymer (or photopolymer) of our invention. Preferably, the liquid composition comprises the liquid carrier and about 1 to 50 wt-% of the photopolymer, and more preferably about 5 to 20 wt-% of the photopolymer.

For practical use, two or more different photopolymers with equal or different amounts of photoactive units in them can be used at the same time in a composition to achieve best performance. For example, photopolymers derived from polyvinylpyridine and polyvinylalcohol can be used in the same composition. To achieve best crosslinking in between polymers, photoactive sites in the two or more polymers should have similar structure and have similar or equal photoresponse. The synthetic approach of our invention to the photoactive precursors of the polymers is units of similar or equal photoproperties. Another way of achieving similar results in a photoresist is to incorporate two or more different photoactive pendant groups in a polymer chain.

The liquid composition is generally a solution or a dispersion of the photopolymer in the liquid carrier. This can take the form of an aqueous solution, an emulsion, an organic solution, or other dispersions or solutions used by those of ordinary skill in the art. The liquid carrier may be water or otherwise aqueous in nature, e.g., an aqueous acidic solution, or it may be an organic solvent or an organic liquid bulk phase in an emulsion or dispersion.

Other components which do not detrimentally affect the pH and photosensitive nature of the photopolymer to an extent sufficient to defeat its operability can be compounded or added to the material of such a photoresist film. Optional components of the photoresist film may include plasticizers, sensitizers, photocross-linking agents, surfactants, defoaming agents, photoinitiators, fillers, reinforcing media, pigments or dyes, antioxidants, and other materials which impart desired properties to the photosensitive material of our invention. Further, the photoresist film can take the form of a screen printing stencil if applied to a screen mesh useful in such operations.

The photoresist composition can contain virtually any plasticizer that is compatible with the photo cross-linkable polymer composition and any film-forming binder polymeric composition, in the aqueous suspension. Both monomeric and polymeric plasticizers can be used in the resist composition. Monomeric plasticizers are typically plasticizers comprising small molecules having a molecular weight of less than about 1,000. Polymeric plasticizers are typically polymeric compounds commonly with molecular weights greater than about 1,000. Typical monomeric plasticizers include dialkyl adipates, dialkyl acetates, dialkyl benzoates, dialkyl citrates, dialkyl derivatives of phthalic anhydride and isophthalic anhydride, alkyl sebacates, alkyl stearates, dialkyl terephthalates, trialkyl esters of trimelitic anhydride, and the like. Polymeric plasticizers include the various polyglycols and derivatives thereof, epoxy derivatives of stearate esters or phthalate esters, and polyester plasticizers such as SANTICIZER™ and PARAPLEX™ plasticizers.

Sensitizers commonly used in photopolymerizable resist compositions are monomers having photo sensitive ethylenically unsaturated groups such as vinyl, acryloyl, methacryloyl, allyl, vinyl ether, acrylamide, or other groups or prepolymers thereof having an average degree of unsaturation of about 1 to 5. Examples of sensitizers having a single ethylenically unsaturated group include acrylamide, acrylic acid, methacrylic acid, methyl methacrylate, and methylol acrylamide. Preferred polyfunctional sensitizers have two or more photosensitive ethylenically unsaturated groups including sensitizers such as pentaerythritol triacrylate, pentaerythritol tetraacrylate, pentaerythritol trimethacrylate, pentaerythritol tetramethacrylate, 2,2,-dibromo methyl, 1,3-propane diacrylate, triallyl isocyanurate, N,N'-methylene bis-acrylamide, and prepolymers thereof. The most preferred sensitizer comprises pentaerythritol triacrylate.

The composition of the present invention can further comprise a diazo resin complex photocross-linking agent. As the diazo resin, water-soluble diazo resins formed by condensing diazotization products of diphenylamines such as p-aminodiphenylamine, 4-amino-4'-methyldiphenylamine, 4-amino-4'-ethyldiphenylamine, 4-amino-4'-methoxydiphenylamine, 4-amine-4'-chlorodiphenylamine and 4-amino-4'-nitrodiphenylamine with aldehydes such as p-formaldehyde, acetaldehyde, propionaldehyde and n-butylaldehyde can be used. The complexes can be formed between the above-discussed condensation products and sulfuric acid salts, phosphoric acid salts and zinc chloride double salts. The photocross-linking agent can be used in an amount of up to 20 parts per 100 parts of the light-sensitive heterocyclic quaternary group-added polymer.

Polymerization reaction initiators suitable for use in the invention are those materials which will easily generate free radicals upon exposure to heat or ultraviolet radiation. Examples of these initiators include benzoin-alkyl ethers, Michler's ketone, ditertiary butyl peroxide, dibenzothiazollyl-disulfide, dibromoacetophenone, anthraquinone, azobisisobutyronitrile, and the like. In a similar fashion the ethylenically unsaturated resists of this invention can contain optional functional compounds such as defoamers, surfactants, dyes, antioxidants, or other additives commonly used in this art.

Additional optional additives that can be used in the practice of this invention include surfactants used to increase the compatibility of the aqueous resist composition with the surface of the object and to promote an even coating. A defoamer can be used to insure that the layer of resist is free of small bubbles and other foamed species. A dye can be used to permit visualization of the position and approximate thickness of the resist composition. An antioxidant can be used for the preservation of the concentrations of the crosslinking activator.

The photoresist film comprising the photopolymer may be formed in any manner known to those skilled in the art including spraying, casting, reverse or roll coating, dipping, and doctor blading. Other methods of formation and photosensitive uses beyond those specifically disclosed herein will be recognized by the practitioner. These methods and uses of the invention are intended to be within the scope of the claims appended to the end of this specification.

EXAMPLES

The following specific examples which contain the best mode known to the inventors further illustrate the invention. These examples are merely illustrative of the invention and are not intended to limit its scope.

Example 1

A stirring solution of benzaldehyde (44.6 g) and 4-picoline (37.2 g) in acetic acid (24 g) and acetic anhydride (40.8 g) was refluxed for 18 hours. The resultant reaction mixture were cooled, diluted with dichloromethane (300 ml), washed with water and dilute aqueous alkali; and quenched with dilute hydrochloric acid. Precipitate of styrylpyridine hydrochloride (long golden needles) was separated by filtration, washed with methylenechloride, dried and poured into stirred solution of sodium carbonate in water. After 2 hours of stirring white-gray precipitate was filtered, washed with water and dried overnight at 60–70° C. After recrystallization, 39.6 g. of styrylpyridine were obtained.

Example 2

By the procedure described in Ex. 1, benzaldehyde and quinoline were reacted to obtain 2-styryl-quinoline.

Example 3

By the procedure described in Ex. 1 4-tolualdehyde (12.6 g) and 4-picoline (9.3 g) were reacted to obtain 4-(4-methylstyryl)pyridine.

Example 4

By the procedure described in Ex. 1, 4-methoxybenzaldehyde (17 g) and 4-picoline (9.3 g) 4.76 g were reacted to obtain 4-(4-methoxystyryl)pyridine.

Example 5

Following the procedure of Ex. 1, 4-tolualdehyde and lepidine were converted into 4-(4-methylstyryl)quinoline.

Example 6

4-(4-methylstyryl)quinoline (0.245 g) and 2-(2-bromoethyl) 1,3-dioxane (0.195 g) were mixed and refluxed in ethylacetate (1.5 ml) for 18 hours. Yellow-green precipitate was separated by filtration, washed with ethyl ether and dried in vacuo to give 0.308 g of N-[2-(1,3-dioxane-2-yl)ethyl]-4-(4-methylstyryl)-quinolinium bromide.

Example 7

Lepidine (0.28 g) and 2-(2-bromoethyl) 1,3-dioxane (0.39 g) were stirred and refluxed in acetonitrile (3 ml) for 3 hours. Solvent was evaporated, and 4-tolualdehyde (0.48 g), piperidine (0.06 g) and methanol (10 ml) were added to the reaction mixture. Stirring and refluxing were continued for 24 hours. Yellow-green crystals which appeared after cooling were separated by filtration, washed with ethyl ether and dried in vacuo to give 0.29 g of a product that showed same NMR, IR and UV-spectra as the N-[2-(1,3-dioxane-2-yl)ethyl]-4-(4-methyl styryl)pyridinium bromide obtained in example 6.

Example 8

4-styrylpyridine (1.81 g) and 2-(2-bromoethyl) 1,3-dioxane (1.95 g) were stirred and refluxed in ethylacetate (15 ml) solution for 15 hours. After cooling of the reaction mixture creamy crystals were separated by filtration, washed with ethyl ether and dried to give 3.4 g of N-[2-(1,3-dioxane-2-yl)ethyl]-4-styrylpyridinium bromide.

Example 9

By the procedure described in Ex 8., 4-styrylpyridine (3.62 g) and 2-(2-bromoethyl) 1,3-dioxolane (3.76 g) were reacted to obtain N-[2-(1,3-dioxolane-2-yl)ethyl]-4-styrylpyridinium bromide.

Example 10

By the procedure described in Ex. 8 4-styrylpyridine and 2,2-diethoxyethyl bromide were reacted to obtain N-(2,2-diethoxyethyl)-4-styrylpyridinium bromide.

Example 11

By the procedure described in Ex. 8, 4-(4-methylstyryl)pyridine and 2-(2-bromoethyl) 1,3-dioxane were reacted to obtain N-[2-(1,3 dioxane-2-yl)ethyl]-4-(4-methylstyryl)pyridinium bromide.

Example 12

By the procedure described in Ex. 8, 4-(4-methoxystyryl)pyridine and 2-(2-bromoethyl) 1,3-dioxane were reacted to obtain N-[2-(1,3-dioxane-2-yl)ethyl]-4-(4-methoxystyryl)pyridinium bromide.

Example 13

To 9 g of water, 1 g of 87–89% saponified poly (vinylacetate) having a polymerization degree of 1700 was added and stirred with application of heat. Then, 0.113 g of N-[2-(1,3-dioxane-2-yl)ethyl]-4-styrylpyridinium bromide and 0.05 g of phosphoric acid (85% soln) were added, and the resultant solution was stirred at 80° C. for 9 hours. The solution was poured into a large volume of acetone, and the resulting precipitate was thoroughly washed with methanol, filtered and dried. The resin was estimated to have styrylpyridinium units of 0.68 MOL % on the basis of the ultraviolet absorption spectra (max. absorption at 345 nm).

Example 14

4.43 g of poly(vinylalcohol) (99+% hyrolyzed) having a polymerization degree of 2500 was dissolved in 40 g of water by application of heat. The solution was mixed with 6 ml of water having dissolved in advance therein 0.47 g of N-[2-(1,3-dioxan-2-yl)ethyl]-4-styrylpyridinium bromide and 0.245 g of 85% phosphoric acid. The solution was stirred at +70° for 30 hours. The reaction solution has a styrylpyridinium units of 0.85 mol % based on the poly (vinylalcohol). This reaction solution was applied in its unmodified form to a screen of 230 mesh made of polyester and dried with the result that a membrane of uniform thickness was formed. The membrane was exposed through a positive and washed with water. As a result, a clear negative image was obtained.

Example 15

28 g of 17% water solution of poly(vinylacetate) (87–89% saponified, average degree of polymerization of 1700) was added to 20 g of solution containing 0.88 g of dissolved N-[2-(1,3-dioxane-2-yl)ethyl]-4-styrylquinolinium bromide and 1 g of 85% phosphoric acid and the solution was stirred at 60° C. for 48 hours. When this reaction solution was applied to a screen of 310 mesh made of polyester, dried, exposed to a pattern of light and washed with water there was obtained a clear negative image.

Example 16

To 5 g of water 0.5 g of 87–89% saponified poly (vinylacetate) having a polymerization degree of 1700 was added and dissolved with heat application. The solution was mixed with 1 g of water containing 0.055 g of dissolved N-[2-(1,3-dioxolane-2-yl)ethyl]-4-styrylpyridinium bromide and 0.05 g of 87% phosphoric acid. Resulting solution was stirred at 70° C. for 8 hours. The resin was precipitated as described in example 13 and was estimated to have styrylpyridinium units of 1.1 mol %. The polymer was dissolved in a water, applied on a screen, photographically exposed and washed out with water to give very clear negative image.

Example 17

A mixture of 0.91 g of 4-styrylpyridine and 2.44 g of 1,6-dibromohexane in 15 ml of ethylacetate was stirred and refluxed for 3 hours then filtered while hot. The crystals obtained were washed with an additional portion of ethylacetate and dried in vacuo to give 1.84 g of N(6-bromohexyl)-4-styrylpyridinium bromide. $\lambda_{max}$ 343 nm (water). NMR (CDCl$_3$, p.p.m.): 9.4 (d.,2H), 8.2 (d.,2H), 7.2–7.8 (m.,7H), 4.9(t.,2H), 3.35(T.,2H), 1.2–2.2 (br.m., 8H).

Example 18

A mixture of 4-styrylpyridine (0.181 g) and 1,4-dibromobutane (0.432 g) in ethylacetate (5 ml) was stirred and refluxed for 24 hours, and then filtered. The crystals obtained were washed and dried to give 0.31 of N-(4-bromobutyl)-4-styrylpyridinium bromide $\lambda_{max}$ of 344 nm (water). NMR (CDCl$_3$, p.p.m.): 9.4(d.,2H), 8.0(d.,2H), 7.0–7.7(m.,7H), 4.9(T.,2H), 3.4(m.,2H), 2.0(m.,4H).

Example 19

N(6-bromohexyl)-4-styrylpyridinium bromide (1.28 g) and 42 g of ~26% methanol solution of poly(4-vinylpyridine) MOL.W. ~200000) were stirred and refluxed for 16 hours. The resulting solution was applied on a screen, dried, exposed to a pattern of light and washed with high-pressure water. A negative image was obtained.

Example 20

20 g of light-sensitive resin described in Example 19 were mixed with 2.0 g of glacial acetic acid and 80 g of polyvinylacetate (XR-2223, 55% solids available from H.B. Fuller Co.). The mixture was applied on a screen of 110 mesh made of polyester, dried, exposed to a pattern of light and washed with water to obtain a clear negative image.

Example 21

20 g of light-sensitive resin solution prepared according to the procedure described in Example 16 without purification were mixed with 80 g of polyvinylacetate (XR-2223, 55% solids available from H.B. Fuller Co.). Resulting mixture was applied on a screen, dried, exposed to light and washed with water to give a clear negative image.

Example 22

50 g of the final mixture of Example 20 and 50 g of the final mixture of the Example 21 were combined together and mixed for 5 minutes. Resulting mixture was applied on a screen, dried, exposed and washed out with water. Obtained membrane showed well resolved image and good water resistance.

Examples 23 through 26 represent "dual" and "triple-cure" mixes in which the components are:

| | |
|---|---|
| Liquor A | is 12% water solution of light-sensitive resin prepared according to the procedure described in Example 16. |
| Liquor B | is 26% methanol solution of light-sensitive resin described in Example 19. |
| Pigment | Ponolith Blue RDS Liquor/Mobay |
| Surfactant | Silwet L7607 |
| PVA | 18% water solution of polyvinylalcohol Airvol 523 |
| PVAc | 55% water dispersion of polyvinylacetate. XR-2223 (H. B. Fuller Company) |
| Oligomer | EBECRYL 4827, Radcure Specialties |
| Monomer | Photomer 4094, Henkel Corp. |
| Initiator | Irgacure 500, CIBA-Geigy |

Example 23

| | |
|---|---|
| Liquor A | 170 g |
| Pigment | 1 g |
| Surfactant | 2 g |
| PVAC | 50 g |
| Oligomer | 60 g |
| Monomer | 30 g |
| Initiator | 20 g |

Example 24

| | |
|---|---|
| Liquor A | 100 g |
| PVA | 100 g |
| PVAc | 100 g |
| Oligomer | 60 g |
| Monomer | 30 g |
| Initiator | 20 g |
| Diazo | 0.6 g |
| Pigment | 0.5 g |

Example 25

| Liquor A | 20 g |
|---|---|
| Liquor B | 10 g |
| Acetic Acid | 1.5 g |
| PVA | 20 g |
| PVAc | 50 g |
| Diazo Resin | 0.6 g |
| Pigment | 0.2 g |

Example 26

| Liquor B | 20 g |
|---|---|
| Acetic Acid | 3 g |
| Oligomer | 6 g |
| Monomer | 3 g |
| Initiator | 2 g |
| PVA | 40 g |
| Diazo | 0.8 g |
| Pigment | 0.2 g |

The foregoing description, examples and data are illustrative of the invention described herein, and they should not be construed to unduly limit the scope of the invention or the claims, since many embodiments and variations can be made while remaining within the spirit and scope of the invention. The invention resides wholly in the claims hereinafter appended.

What is claimed is:

1. A method for preparing photosensitive polymers comprising the steps of:
   (a) reacting an aldehyde substituted aromatic compound and an alkyl substituted nitrogen-containing heterocyclic compound in the presence of a catalyst to form a first reaction product having ethylenic unsaturation and a quaternary or quaternizable nitrogen atom;
   (b) reacting the first reaction product with a substituted or unsubstituted alkyl, aralkyl, or hetero reactive compound having one or more terminal groups selected from the group consisting of halogen, ether and aldehyde to form a second reaction product having a quaternary nitrogen atom;
   (c) grafting onto a polymeric backbone, resulting from the polymerization of substituted vinyl monomers, olefins or acetylenes, about 0.1 to 20 mol-% (based on the available reactive sites on the polymeric backbone) of the second reaction product through the residue of the reactive compound of step (b) to form a photopolymer.

2. The method of claim 1 further comprising stirring under reflux for 2 to 24 hours the reactants of step (a) in the presence of a carboxylic acid and a carboxylic acid anhydride.

3. The method of claim 1 further comprising precipitating, filtering, and washing the first reaction product with a solvent before carrying out step (b).

4. The method of claim 1 further comprising recrystallizing the first reaction product from a solution of the product in an aqueous carbonate solution before carrying out step (b).

5. The method of claim 1 further comprising stirring under reflux for 2 to 24 hours the reactants of step (b) in the presence of a liquid acetate compound.

6. The method of claim 1 further comprising filtering, washing with a lower alkyl ether solvent, and drying the second reaction product.

7. The method of claim 1 further comprising stirring the components of step (c) at about 20 to 200° C.

8. The method of claim 1 further comprising reacting the components of step (c) in the presence of an aqueous mineral acid catalyst.

9. A method for preparing photosensitive polymers comprising the steps of:
   (a) reacting (i) a substituted or unsubstituted alkyl, aralkyl, or hetero reactive compound having one or more terminal moiety selected from the group consisting of halogen, ether and aldehyde and (ii) an alkyl substituted nitrogen-containing heterocyclic compound to form a first reaction product having a quaternary nitrogen atom;
   (b) reacting the first reaction product with an aldehyde substituted aromatic compound in the presence of a catalyst to form a second reaction product having ethylenic unsaturation and a quaternary nitrogen atom;
   (c) grafting onto a polymeric backbone, resulting from the polymerization of substituted vinyl monomers, olefins or acetylenes, about 0.1 to 20 mol-% (based on the available reactive sites on the polymeric backbone) of the second reaction product through the residue of the reactive compound of step (a)(i) to form a photopolymer.

10. The method of claim 9 further comprising stirring under reflux for 0.1 to 10 hours the reactants of step (a) in the presence of a solvent.

11. The method of claim 10 further comprising evaporating the solvent from the first reaction product.

12. The method of claim 11 further comprising stirring under reflux for 10 to 30 hours the reactants of step (b).

13. The method of claim 11 further comprising precipitating the second reaction product by cooling the reaction mixture.

14. The method of claim 11 further comprising filtering, washing with a lower alkyl ether solvent, and drying the second reaction product.

15. The method of claim 9 further comprising stirring the components of step (c) at about 20 to 200° C.

16. The method of claim 9 further comprising reacting the components of step (c) in the presence of an aqueous mineral acid catalyst.

* * * * *